INVENTORS
Takashi Tokuyama
Keijiro Uehara
BY
Paul M. Craig Jr.
ATTORNEY

INVENTORS
Takashi Tokuyama
Keijiro Uehara
BY Paul M. Craig, Jr.
ATTORNEY

United States Patent Office 3,445,280
Patented May 20, 1969

3,445,280
SURFACE TREATMENT OF SEMICONDUCTOR DEVICE

Takashi Tokuyama and Keijiro Uehara, Tokyo, Japan, assignors to Hitachi, Ltd., Tokyo, Japan Filed Aug. 9, 1965, Ser. No. 478,113
Claims priority, application Japan, Aug. 8, 1964, 39/45,318
Int. Cl. H01b *1/00;* C23c *13/00*
U.S. Cl. 117—215 6 Claims

ABSTRACT OF THE DISCLOSURE

The present disclosure is directed to a method of surface treating a semiconductor device which comprises the steps of depositing a first silicon dioxide film with a thickness of about 2,000 A. or less on the surface of said semiconductor device by thermally decomposing organo-oxysilane, heat-treating said semiconductor device containing said first silicon dioxide film in a high vacuum of at least about $1\times10^{-3}$ mm. Hg or more at a temperature of about 500 to 800° C. in order to substantially remove all of the absorbed gases produced by said thermal decomposition of organo-oxysilane, and after said vacuum-heat treatment, depositing a second silicon dioxide film on said first silicon dioxide film by thermal decomposition of organo-oxysilane.

The present invention relates to improvements of surface treatment of semiconductor devices and is to prevent the lowering of the breakdown voltages of semiconductor devices.

One of the methods commonly used for protecting the surfaces of semiconductor devices from detrimental substances such as moisture or the like is the formation of silicon dioxide films, as protecting films, on the surfaces of the semiconductor devices.

As such protective film formation method, there are methods of directly oxidizing the surfaces of the semiconductor devices, thermally decomposing organo-oxysilane, or the like. The thermal decomposition method of organo-oxysilane is particularly superior in that it is applicable not only to silicon substrates but also to germanium substrates. However, this method has a disadvantage that the breakdown voltage of the device falls in the course of a process of the deposition of the silicon dioxide film, although surface passivation can be attained. In order to overcome this difficulty, methods in which the organo-oxysilane is decomposed in various atmosphere consisting of, such as, for example, nitrogen, argon or the like, the surface of the semiconductor device is treated prior to the deposition of the silicon dioxide film, or the like have been and are being attempted. However, even in case these methods are utilized, although satisfactory results are attained for devices with comparatively low breakdown voltages, devices with high breakdown voltages still suffer the lowering of the breakdown voltages.

The present invention is intended to overcome such shortcomings. While in the conventional methods the silicon dioxide film has been deposited in one process on the semiconductor device through the thermal decomposition of the organo-oxysilane, in the present invention the deposition is carried out in two processes. That is, after first slight deposition of the silicon dioxide film, unreacted organo-oxysilane and hydrocarbons produced through thermal decomposition contained in such film are completely removed by heating the device in vacuum. Then, second deposition of the silicon dioxide film is carried out.

By such method, not only the passivation of the surface of the semiconductor device, but also the formation of the silicon dioxide film without lowering the breakdown voltage even in the semiconductor device with high breakdown voltage have become possible.

The advantages of the present invention will be apparent from the following detailed description given with reference to the accompanying drawings in which.

Now the description of the present invention will be made with reference to examples.

EXAMPLE 1

Figure 1:
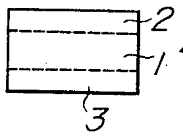
FIG. 1 is a sectional view of a semiconductor device prior to the deposition of silicon dioxide film.
Figure 2:
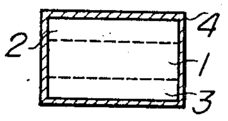
FIG. 2 is a sectional view of a semiconductor device on the surface of which the silicon dioxide film is formed by a conventional method.
Figure 3:
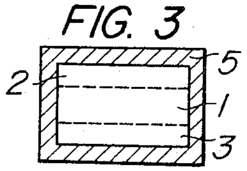
FIGS. 3 and 4 are sectional views of semiconductor devices on the surfaces of which the silicon dioxide films are formed by the method of the present invention.
Figure 4:
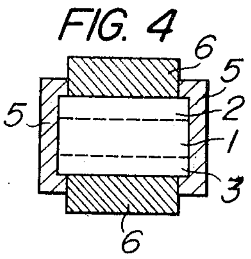
Figure 5:
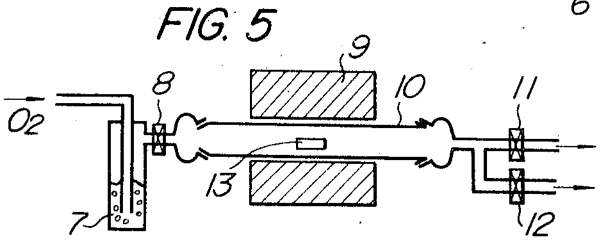
FIG. 5 is an apparatus for depositing the silicon dioxide film.

This is the case where a silicon dioxide film is formed on the surface of a semiconductor device substrate for $p^+nn^+$ silicon rectifier fabricated by coating one surface of an n-type silicon substrate of resistivity 100~200Ω cm. with $B_2O_3$ and the other surface with $P_2O_5$, respectively, and then diffusing for 10 hours at 1300° C. FIG. 1 is a sectional view of a sample in which the diffusion and subsequent etching have been completed. In FIG. 1 reference numeral 1 designates an n-layer of the substrate, 2 a $p^+$-layer formed by diffusing $B_2O_3$, and 3 an $n^+$-layer formed by diffusing $P_2O_5$. Such a device is treated by an apparatus for depositing silicon dioxide film as shown in FIG. 5. A sample of the semiconductor device 13 is put in a silica tube 10 which is a reaction furnace. After the reaction furnace has reached 700° C. by energizing an electric furnace, 9, cocks 8 and 11 are opened and the reaction furnace is fed with oxygen and tetraethoxy-silane vaporized by flowing the oxygen at the rate of 0.5 l./min. through tetraethoxy-silane 7 kept at a definite temperature, which is thermally decomposed to form the first silicon dioxide film on the surface of the semiconductor device 13. The resulting device is shown in FIG. 2 wherein the film 1500 A. thick was formed for 8 minutes. Next, the cocks 8 and 11 in FIG. 5 are closed and a cock 12 is opened, after which the gas in the silica tube 10 is evacuated to the pressure of $1\times10^{-5}$ mm. Hg by means of an oil-diffusion pump. Then, unreacted tetraethoxy-silane and hydrocarbons produced by the thermal decomposition of the tetraethoxy-silane being included in the first silicon dioxide film are completely removed by heating the sample 13 at 700° C. for 2 hours in the vacuum. Then the second silicon dioxide film is formed superposed on the first silicon dioxide film 4 by thermally decomposing tetraethoxy-silane again introduced together with oxygen by closing the cock 12 and opening the cocks 8 and 11. The process of the deposition of the second film is carried out for 30 minutes, resulting in the film 7500 A. thick in total which is indicated by reference numeral 5 in FIG. 3. FIG. 4 shows a silicon rectifier fabricated by forming apertures through the silicon dioxide film of the semiconductor device of FIG. 3 and attaching electrodes 6 thereto.

Figure 6:
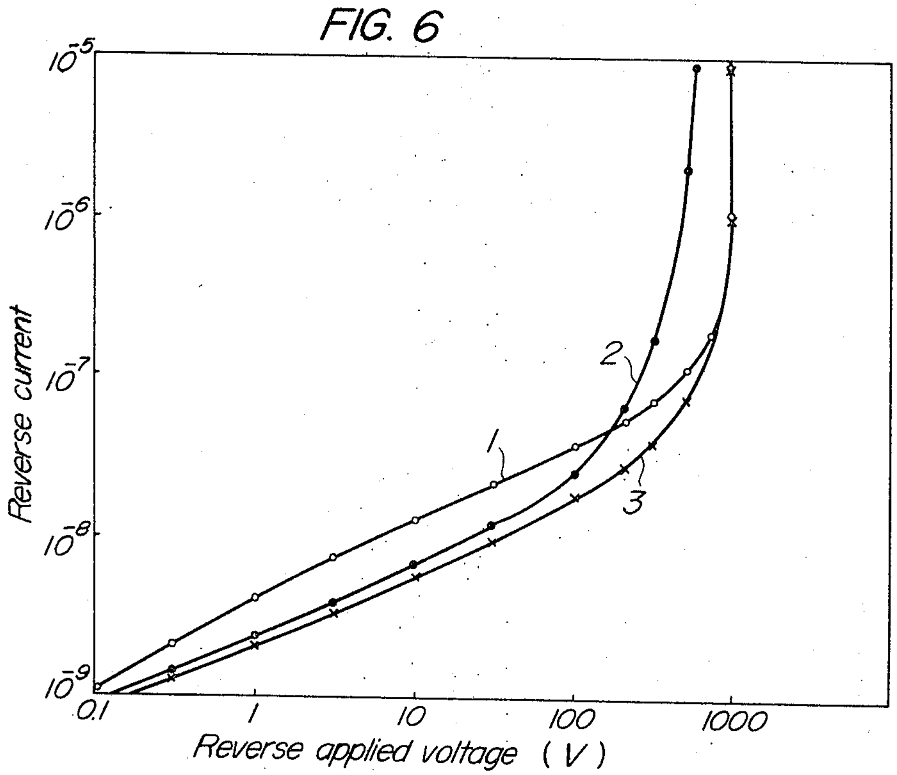
FIG. 6 is diagrams of reverse voltage vs. current characteristics of semiconductor devices.

Comparison of reverse voltage vs. current characteristics of the devices according to the present invention and the conventional method is shown in FIG. 6, wherein curve 1 is for the semiconductor device prior to the formation of the silicon dioxide film, curve 2 is for the device according to the conventional method, and curve 3 is for the device according to the present invention. As is evident from these characteristic curves, according to the conventional method, the breakdown voltage is lowered by approximately 300 volts by the deposition of the silicon dioxide film, whereas according to the present invention, the expected breakdown voltage is obtained without any lowering.

EXAMPLE 2

The same results as for the silicon semiconductor device were obtained for the germanium semiconductor device on which the silicon dioxide film is deposited by the same method as Example 1 except that nitrogen is used instead of oxygen.

As an atmosphere in which the silicon dioxide film is deposited, an oxidizing atmosphere is desirable in the case of the silicon substrate of Example 1, because a more stable film is obtainable in the oxidizing atmosphere compared with in a non-oxidizing atmosphere. On the other hand, in the case of the germanium substrate of this Example 2, the non-oxidizing atmosphere such as nitrogen, argon or the like was used because of the necessity of protecting the surface of the germanium substrate from oxidization prior to the deposition of the silicon dioxide film. If the germanium is oxidized, GeO and/or $GeO_2$ are produced. Since GeO evaporates from the surface of the substrate and $GeO_2$ is a powder, the surface of the substrate becomes a coarse and eroded state. Thus, the deposition of a uniform and firm silicon dioxide film is impossible in the oxidizing atmosphere.

Figure 7:
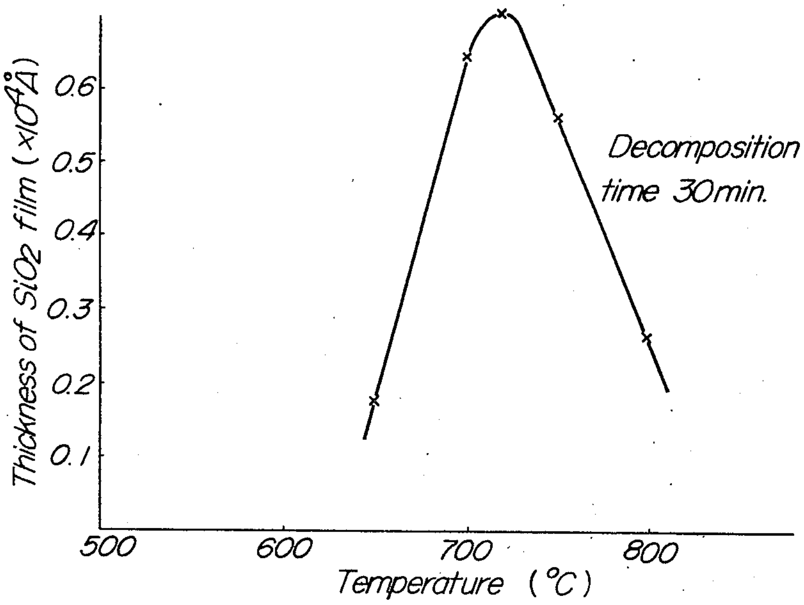
FIG. 7 is a characteristic curve representing the relation between the thickness of the silicon dioxide film and the temperature of a furnace.
Figure 8:
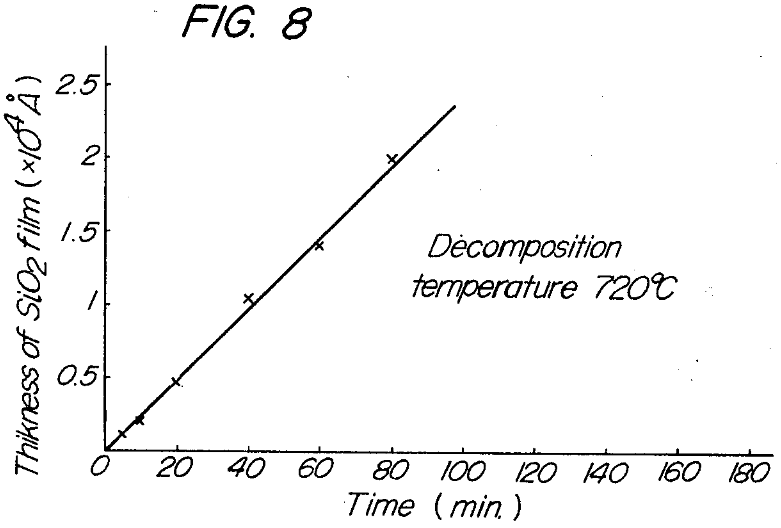
FIG. 8 is a characteristic curve representing the relation between the thickness of the silicon dioxide film and deposition time.

FIGS. 7 and 8 are characteristic curves showing the relation between the thickness of silicon dioxide film produced by thermal decomposition of organo-oxysilane. thermal decomposition temperature and time. From these characteristic curves a desired thickness is obtainable by selecting suitable temperature and time therefor.

As stated above, the semiconductor device with a high breakdown voltage on which the silicon dioxide film is deposited by the conventional method was inevitably subjected to the lowering of the breakdown voltage by 20 to 40%, whereas, according to the present invention, little lowering of the breakdown voltage is encountered and satisfactory values have been obtained.

This is considered to have resulted from the complete removal of the unreacted tetraethoxy-silane, the hydrocarbons produced due to the thermal decomposition thereof and the like which were on the semiconductor device substrate caused by heating the semiconductor device substrate in vacuum after the first thin silicon dioxide film had been deposited thereon.

Incidentally, if the first silicon dioxide film is too thick, the unreacted organo-oxysilane, the hydrocarbons produced due to the thermal decomposition, and the like lying deep in the silicon dioxide film cannot be removed completely by the heat treatment in vacuum. As a result of various experiments, it was found that a preferred thickness of the first silicon dioxide film is 2000 A. or less. On the other hand, since the purpose of providing the silicon dioxide film is to protect the semiconductor device, too thin film is not effective. According to our study, it was found that at least 3000 A. or more of thickness of the silicon dioxide film is necessary as a protective film of the semiconductor device. Consequently, if the first film is 1000 A. thick, the second film should be of more than 2000 A. thickness, and if the thickness of the first film is 2000 A., then the second film is necessary to be 1000 A. thick or more. Furthermore, if the degree of vacuum for the subsequent heat treatment is low, even if the thickness of the first silicon dioxide film is less than 2000 A., the unreacted organo-oxysilane, the hydrocarbons produced due to the thermal decomposition, and the like existing in said film cannot be completely removed. Accordingly, high vacuum of at least $10^{-3}$ mm. Hg or more is necessary, and moreover it is desirable that the semiconductor device is heated to 500 to 800° C. The higher the temperature, the more effectively the unreacted organo-oxysilane, the hydrocarbons produced due to the thermal decomposition and the like existing in the silicon dioxide film go out of the film by diffusion. However, if the temperature is too high, p-type and n-type impurities in the semiconductor crystal constituting the semiconductor device re-diffuse in the crystal, so that the electrical characteristics of the semiconductor device varies. Therefore, in order to sufficiently manifest the advantages of the present invention, it has been found that a suitable temperature for the heat treatment in vacuum is 500° to 800° C.

As seen from the above description, according to the present invention, the fabrication of semiconductor devices with stable surfaces and high breakdown voltages is possible and excellent industrial advantages result.

What we claim is:

1. A method of surface treating a semiconductor device which comprises the step of depositing a first silicon dioxide film with a thickness of about 2,000 A. or less on the surface of said semiconductor device by thermally decomposing organo-oxysilane, heat-treating said semiconductor device containing said first silicon dioxide film in a high vacuum of at least about $1\times10^{-3}$ mm. Hg or more at a temperature of about 500 to 800° C. in order to substantially remove all of the absorbed gases produced by said thermal decomposition of organo-oxysilane, and after said vacuum-heat-treatment, depositing a second silicon dioxide film on said first silicon dioxide film by thermal decomposition of organo-oxysilane.

2. The method of surface treatment of a semiconductor device according to claim 1, wherein the total thickness of the first and second silicon dioxide films is 3,000 A. or more.

3. The method of surface treatment of a semiconductor device according to claim 2, wherein all of the process steps are conducted in the same furnace.

4. The method of surface treatment of a semiconductor device according to claim 1, wherein all of the process steps are conducted in the same furnace.

5. The method of claim 1, wherein the semiconductor device is silicon and the deposition atmosphere is oxygen.

6. The method of claim 1, wherein the semiconductor device is germanium and the deposition atmosphere is selected from the group consisting of nitrogen and argon.

References Cited

UNITED STATES PATENTS

| | | | |
|---|---|---|---|
| 3,158,505 | 11/1964 | Sandor | 117—215 |
| 3,242,007 | 3/1966 | Jensen | 117—201 |

WILLIAM L. JARVIS, *Primary Examiner.*

U.S. Cl. X.R.

117—62, 106, 201